(12) United States Patent
Uchida et al.

(10) Patent No.: US 9,845,404 B2
(45) Date of Patent: Dec. 19, 2017

(54) CONDUCTIVE COMPOSITION FOR THIN FILM PRINTING AND METHOD FOR FORMING THIN FILM CONDUCTIVE PATTERN

(71) Applicant: SHOWA DENKO K.K., Tokyo (JP)

(72) Inventors: Hiroshi Uchida, Tokyo (JP); Shoichiro Wakabayashi, Tokyo (JP); Jun Dou, Tokyo (JP); Takahiko Ono, Tokyo (JP); Masumi Kuritani, Tokyo (JP)

(73) Assignee: SHOWA DENKO K.K., Minato-ku, Tokyo (JP)

( * ) Notice: Subject to any disclaimer, the term of this patent is extended or adjusted under 35 U.S.C. 154(b) by 0 days.

(21) Appl. No.: 15/032,388

(22) PCT Filed: Oct. 28, 2014

(86) PCT No.: PCT/JP2014/078617
§ 371 (c)(1),
(2) Date: Apr. 27, 2016

(87) PCT Pub. No.: WO2015/064567
PCT Pub. Date: May 7, 2015

(65) Prior Publication Data
US 2016/0251531 A1    Sep. 1, 2016

(30) Foreign Application Priority Data

Oct. 31, 2013  (JP) .................................. 2013-226484
Dec. 25, 2013  (JP) .................................. 2013-266936

(51) Int. Cl.
*C09D 11/52*        (2014.01)
*C09D 11/037*       (2014.01)
(Continued)

(52) U.S. Cl.
CPC ............ *C09D 11/52* (2013.01); *C09D 11/037* (2013.01); *C09D 11/10* (2013.01); *H01B 1/02* (2013.01);
(Continued)

(58) Field of Classification Search
CPC ....... C09D 11/52; C09D 11/037; C09D 11/10; H01B 1/02; H01B 1/22; H05K 1/092; H05K 2201/0245; H05K 3/1216; H05K 3/1291
(Continued)

(56) References Cited

U.S. PATENT DOCUMENTS 4,827,083 A * 5/1989 Inasaka .................. H05K 1/092
                                                    252/514
7,981,327 B2   7/2011 Sakaguchi et al.
(Continued)

FOREIGN PATENT DOCUMENTS

CN    102820072 A    12/2012
EP    1 860 163 A1   11/2007
(Continued)

OTHER PUBLICATIONS

International Search Report for PCT/JP2014/078617 dated Dec. 16, 2014.
(Continued)

*Primary Examiner* — Helene Klemanski
(74) *Attorney, Agent, or Firm* — Sughrue Mion, PLLC (57) ABSTRACT

Provided are a conductive composition for thin film printing and a method for forming a thin film conductive pattern, which can easily performing thin film printing, and can capable of improve conductivity by thermal sintering at a comparatively low temperature of 300° C. or less or by photo irradiation. A conductive composition comprises metal particles, a binder resin, and a solvent, the content of
(Continued)

an organic compound in the solvent being 5 to 98% by mass, the organic compound comprising a hydrocarbon group having a bridged cyclic structure and a hydroxyl group, the content of metal particles being 15 to 60% by mass, the metal particles containing 20% by mass or more of flat metal particles, the content of the binder resin being 0.5 to 10 parts by mass relative to 100 parts by mass of the metal particles, and the viscosity at 25° C. being $1.0 \times 10^3$ to $2 \times 10^5$ mPa·s. The composition is printed in a pattern having any selected shape on a substrate, by screen printing, and the pattern is subjected to thermal sintering at a temperature of 300° C. or less and/or subjecting the pattern to pulsed light irradiation.

18 Claims, 1 Drawing Sheet (51) Int. Cl.
  *C09D 11/10* (2014.01)
  *H01B 1/02* (2006.01)
  *H01B 1/22* (2006.01)
  *H05K 1/09* (2006.01)
  *H05K 3/12* (2006.01)
  *B41F 15/00* (2006.01)

(52) U.S. Cl.
  CPC .............. *H01B 1/22* (2013.01); *H05K 1/092* (2013.01); *H05K 3/1216* (2013.01); *H05K 3/1291* (2013.01); *B41F 15/00* (2013.01); *H05K 2201/0245* (2013.01)

(58) Field of Classification Search
  USPC ........................................ 106/31.92; 252/514
  See application file for complete search history.

(56) References Cited

U.S. PATENT DOCUMENTS

| | | | | |
|---|---|---|---|---|
| 9,236,162 | B2* | 1/2016 | Suganuma | H01B 1/22 |
| 9,318,243 | B2* | 4/2016 | Uchida | C09D 11/52 |
| 2006/0163744 | A1* | 7/2006 | Vanheusden | C09D 11/52 |
| | | | | 257/773 |
| 2008/0169122 | A1 | 7/2008 | Shiraishi et al. | |
| 2010/0051319 | A1* | 3/2010 | Schmitt | H01B 1/22 |
| | | | | 174/126.1 |
| 2010/0051333 | A1* | 3/2010 | Oki | C09D 11/52 |
| | | | | 252/514 |
| 2010/0270515 | A1* | 10/2010 | Yasuda | H01B 1/22 |
| | | | | 252/514 |
| 2012/0119153 | A1 | 5/2012 | Choi | |
| 2013/0302603 | A1* | 11/2013 | Konno | H01B 1/02 |
| | | | | 428/354 |
| 2014/0332734 | A1 | 11/2014 | Uchida | |
| 2015/0103269 | A1* | 4/2015 | Suganuma | H05K 3/1291 |
| | | | | 349/12 |
| 2015/0137347 | A1* | 5/2015 | Nakako | H01B 1/22 |
| | | | | 257/734 |
| 2015/0217411 | A1* | 8/2015 | Ishikawa | H01B 1/22 |
| | | | | 257/772 |
| 2016/0041649 | A1* | 2/2016 | Uchida | H05K 3/1291 |
| | | | | 345/174 |

FOREIGN PATENT DOCUMENTS

| | | |
|---|---|---|
| EP | 2 455 947 A1 | 5/2012 |
| JP | 2005-15647 A | 1/2005 |
| JP | 2007-66824 A | 3/2007 |
| JP | 2007-107057 A | 4/2007 |
| JP | 2011-60752 A | 3/2011 |
| JP | 2012-151276 A | 8/2012 |
| JP | 2012-256500 A | 12/2012 |
| TW | 200717544 A | 5/2007 |
| WO | 2006/035908 A1 | 4/2006 |
| WO | 2013/077447 A1 | 5/2013 |

OTHER PUBLICATIONS

Written Opinion for PCT/JP2014/078617 dated Dec. 16, 2014.
The First Office Action dated Mar. 1, 2017 issued by the State Intellectual Property Office of People's Republic of China in counterpart application No. 201480058103.1.
Extended European Search Report dated May 16, 2017 issued by the European Patent Office in counterpart European application No. 14857914.7.

* cited by examiner

CONDUCTIVE COMPOSITION FOR THIN FILM PRINTING AND METHOD FOR FORMING THIN FILM CONDUCTIVE PATTERN

CROSS REFERENCE TO RELATED APPLICATIONS

This application is a National Stage of International Application No. PCT/JP2014/078617 filed Oct. 28, 2014, claiming priority based on Japanese Patent Application Nos. 2013-226484 filed Oct. 31, 2013 and 2013-266936 filed Dec. 25, 2013, the contents of all of which are incorporated herein by reference in their entirety.

TECHNICAL FIELD

The present disclosure relates to a conductive composition for thin film printing and a method for forming a thin film conductive pattern.

BACKGROUND ART

Recently, each part of electronic devices has become smaller and thinner, and thus, step caused by the thickness of a wiring pattern itself formed on a substrate, often becomes a problem. Therefore, very thin wires are desired. Conventionally, as a technology for producing a fine wiring pattern, a method for patterning a metal thin film, formed by a heating deposition method or a sputtering method, by photolithography has been used. However, the heating deposition method and the sputtering method require a vacuum environment, and the lithography performed thereafter puts a large burden on drainage and liquid waste disposal. Thus, improvement in terms of environment has been desired. Further, the heating deposition method and the sputtering method require a large number of steps, which leads to a very expensive cost. Therefore, when such methods are applied to form a wiring pattern, reduction of the production cost is quite difficult.

Thus, a technology for producing a wiring pattern by printing, using an ink containing a metal or a metal oxide, has been proposed. The wiring technology by printing enables the production of a large amount of products at a low cost and at high speed, and thus, the technology has already been examined for producing a practical electronic device.

In general, gravure printing is used for printing a thin film. However, the gravure printing requires a large scale equipment, and thus, is not suitable for printing a variety kinds in small amounts. Further, the inkjet printing exhibits a low printing speed, and requires metal particles having a particle diameter of several tens nm or less, when an ink containing metal particles is used. Thus, the cost of raw materials is very high.

Therefore, performing thin film printing by screen printing is desired. However, in case of screen printing, a screen plate has a large transmission capacity, and thus, the thickness of the printed pattern is thick to some extent. In addition, in order to maintain the shape of the printed pattern, the ink needs to have a certain viscosity. For the purpose of increasing the viscosity of the ink, if the metal concentration is increased, the film thickness after the solvent is dried, becomes very thick. Instead, if the viscosity is maintained by a binder resin, while the metal concentration is maintained at a low level, there is another drawback that the conductivity cannot be maintained due to the binder resin. Therefore, as described in Patent Document 1, screen printing is performed by an ink containing inorganic acid silver and/or organic acid silver, an organic binder, and a solvent. However, this method requires a very high temperature of 600° C. or more, thus, cannot be applied to a substrate which is weak against heat, or a substrate mounted with parts.

PRIOR ARTS

Patent Document

Patent Document 1: WO 2006/035908.

SUMMARY

An objective of the present disclosure is to provide a conductive composition for thin film printing and a method for forming a thin film conductive pattern, which can be easily applied to the printing of a thin film having a thickness of 3 μm or less, and which can easily increase the conductivity by thermal sintering at the temperature of 300° C. or less, or photo irradiation.

In order to attain the above objective, an embodiment of the present disclosure is a conductive composition for thin film printing, the composition comprising metal particles, a binder resin, and a solvent, the content of an organic compound in the solvent being 5 to 98% by mass, the organic compound comprising a hydrocarbon group having a bridged cyclic structure and a hydroxyl group, the content of metal particles being 15 to 60% by mass, the metal particles containing 20% by mass or more of flat metal particles, the content of the binder resin being 0.5 to 10 parts by mass relative to 100 parts by mass of the metal particles, and the viscosity at 25° C. being $1.0 \times 10^3$ to $2 \times 10^5$ mPa·s.

The organic compound comprising a hydrocarbon group having a bridged cyclic structure, and a hydroxyl group, is preferably isobornylcyclohexanol, tricyclodecanedimethanol, or hydroxydicyclopentadiene, or a mixture of some of these.

Further, the metal particles preferably contain 40% by mass or more of flat metal particles.

The flat metal particle is a sliver flat particle having an aspect ratio (width/thickness of the flat metal particle) of 5 to 200. The metal particles are preferably a mixture of a plurality of kinds of metal particles. The plurality of kinds of metal particles preferably comprises flat particles and spherical nanoparticles.

The binder resin is preferably one selected from a group consisting of poly-N-vinylamide, polyalkylene glycol, polyurethane, a cellulose resin and its derivative, a polyester resin, a chlorinated polyolefin resin, a polyacrylic resin, a polyvinyl acetal (butyral) resin, an epoxy resin, an epoxy acrylate resin, a phenol resin, a melamine resin, and an urea resin.

The poly-N-vinylamide is preferably one selected from a group consisting of poly-N-vinylformamide, poly-N-vinyl acetamide, poly-N-vinylpyrrolidone, and poly-N-vinyl caprolactam, or a copolymer of a monomer of one of these and another vinyl compound. The polyalkylene glycol is preferably one selected from a group consisting of polyethylene glycol, polypropylene glycol, a copolymer of ethylene glycol and propylene glycol (a copolymer having an ethylene oxide unit and a propylene oxide unit) and poly THF (polybutylene glycol). The cellulose resin is preferably one selected from a group consisting of methyl cellulose, ethyl cellulose, hydroxy cellulose, methyl hydroxy cellulose, and cellulose acetate. The epoxy resin is preferably one selected from a group consisting of a bisphenol A-type epoxy resin, a bisphenol F-type epoxy resin, a novolak type epoxy resin, an aliphatic polyvalent epoxy resin, and an alicyclic glycidyl type polyvalent epoxy resin.

The polyurethane is preferably a reactant of at least one hydroxyl group containing compound and at least one isocyanate group containing compound; the hydroxyl group containing compound being at least one type of polyol selected from a group consisting of polyether polyol, polycarbonate polyol, and polyester polyol, at least one type of polyol selected from a group consisting of pentaerythritol, dipentaerythritol, trimethylolpropane, ditrimethylolpropane, and glycerin, or an ethylene oxide adduct and/or an propylene oxide adduct of a p-toluenesulfonic acid; and the isocyanate group containing compound being at least one selected from a group consisting of dicyclohexylmethane-4,4'-diisocyanate, isophorone diisocyanate, hexamethylene-1,6-diisocyanate, and tolylene diisocyanate.

Another embodiment of the present disclosure is a method for forming a thin film conductive pattern comprising a step of printing a pattern having any selected shape on a substrate, by screen printing, using any one of the conductive compositions for thin film printing mentioned above, and a step of subjecting the pattern to thermal sintering at a temperature of 300° C. or less or subjecting the pattern to pulsed light irradiation.

The present disclosure can make printing on a thin film with a thickness of 3 μm or less by screen printing easier, and can realize a conductive composition for printing and/or a method for forming a thin film conductive pattern by which a conductive thin film can be easily formed even on a substrate having a low heat resistance by thermal sintering at a comparatively low temperature of 300° C. or less or by photo irradiation.

EMBODIMENT

An exemplary embodiment (hereinafter, referred to as embodiment) of the present disclosure will be described below.

A conductive composition for thin film printing according to the present embodiment, the composition comprising metal particles, a binder resin, and a solvent, the content of an organic compound in the solvent being 5 to 98% by mass, the organic compound comprising a hydrocarbon group having a bridged cyclic structure and a hydroxyl group, the content of metal particles being 15 to 60% by mass, the metal particles containing 20% by mass or more of flat metal particles, the content of the binder resin being 0.5 to 10 parts by mass relative to 100 parts by mass of the metal particles, and the viscosity at 25° C. being $1.0 \times 10^3$ to $2 \times 10^5$ mPa·s.

The organic compound comprising a hydrocarbon group having a bridged cyclic structure and a hydroxyl group, is for example, isobornylcyclohexanol, tricyclodecanedimethanol, hydroxydicyclopentadiene, or the like. One of these can be used by itself, or some of these can be mixed.

By using this conductive composition for thin film printing (hereinafter, may be referred to as a conductive ink or an ink), a thin film (conductive pattern) can be favorably formed by screen printing, and a coating film exhibiting conductivity can be formed by evaporating and removing a dispersion medium (mainly, solvent). In the present specification, the term "thin film" refers to a film having a thickness of 3 μm or less.

The metal particles are conductive components of the conductive composition (ink) according to the present embodiment. The metal particles should contain flat metal particles, but may contain metal particles with a spherical shape or a shape equivalent thereto having an average particle diameter of 500 nm or less. However, if the content of the metal particles other than the flat metal particles exceeds 80% by mass, the uniformity in thickness and the conductivity may not be sufficiently obtained. Thus, 20% by mass or more of the flat metal particles are contained in the metal particles. More preferably, the content of the flat metal particles is 40% by mass or more.

The flat metal particles contained in the metal particles used in the conductive composition (ink) according to the present disclosure, are plate-like (flat-shaped) including squamous particles. The shape of the plate-like particle is obtained by measuring the thickness and the width of each particle through SEM observation at ten different observation points, at the magnification of 30,000. The thickness is obtained as the number median value of the measured values. The thickness is preferably in the range of 10 to 600 nm, and more preferably 20 to 200 nm. The width is preferably in the range of 0.2 to 5 μm.

The aspect ratio (width/thickness of the flat metal particle) should be large enough to obtain the effect of connecting particles. However, if the aspect ratio is too large, there is a drawback that the printing precision is decreased. Thus, the aspect ratio is preferably in the range of 5 to 200, and more preferably in the range of 5 to 100. If the aspect ratio smaller than 5, conductivity does not easily emerge. If the aspect ratio is larger than 200, printing a fine pattern may become difficult. In case of a fiber-like metal nanowire or metal nanotube, the width and the thickness of the particle cannot be distinguished (the above aspect ratio becomes 1). Thus, such fiber-like metal nanowires or metal nanotubes are not included in the flat metal particles according to the present embodiment, and are not used as metal particles contained in the conductive composition (ink).

The conductive composition (ink) using flat metal particles has a lower viscosity compared to the one using spherical particles, and thus, can reduce the film thickness of the thin film (conductive pattern) by arranging flat metal particles in preferable orientation at the time of printing.

If the thickness of the flat metal particle exceeds 600 nm, the thin film printing becomes difficult. Whereas, the thickness is smaller than 10 nm is not preferable because deformation, etc., may easily occur at the time preparing ink.

With respect to the width of the flat metal particle, too large width is not preferable because a fine wired pattern cannot be printed, whereas too small width is not preferable because the aspect ratio may be restricted and the viscosity becomes too high. Accordingly, the width is preferably in the range of 0.2 to 5 μm, and more preferably in the range of 0.25 to 3 μm.

The material for the metal particles is, for example, at least one selected from a group consisting of gold, silver, platinum, copper, nickel, iron, cobalt, zinc, ruthenium, rhodium, palladium, cadmium, osmium, iridium, and aluminum, or an alloy formed by combining some of these.

Among these metal, containing at least either gold or silver is preferable. Silver flat particles are the best.

A plurality of kinds of metal particles may be mixed, such that mixing metal particles made from different materials selected from the above listed materials, or metal particles made from the same or different materials and having different shapes. Here, mixing different shaped metal particles means mixing flat metal particles and non-flat metal particles. In this case, 20% by mass or more, preferably 40% by mass or more flat metal particles should be mixed.

The non-flat metal particles mentioned above may be, for example, spherical, cubic, etc., particles. Needless to say, large particles cannot be used for thin film printing. Preferable metal particles to be mixed (co-used) with the flat metal particles are spherical nanoparticles having an average particle diameter of 5 to 600 nm, and preferably having an average particle diameter of 10 to 300 nm. Here, the average particle diameter is the median diameter D50. Particle diameters of respective particles were measured using Microtrac Particle Size Distribution Measurement Device MT3000II Series USVR (a laser diffraction-scattering method) or Nanotrac UPA-EX150 (a dynamic light scattering method) manufactured by Nikkiso Co., Ltd., and particle diameters were obtained by spherical approximation, and the median diameter was determined as D50. When the flat metal particles are used together with the spherical nanoparticles, the spherical nanoparticles are located between the flat metal particles, and the spherical nanoparticle play a role to connect the flat metal particles at the sintering process. Thereby, a conductive pattern having a lower resistance can be obtained.

The content of the metal particles in the conductive composition (ink) is 15 to 60% by mass, preferably 20 to 55% by mass, and more preferably 25 to 50% by mass. If the content is lower than 15% by mass, the print unevenness of the printed conductive pattern may be likely to occur. If the content exceeds 60% by mass, the thickness of the printed thin film becomes too thick.

The binder resin used in the conductive composition (ink) according to the present embodiment is, for example, poly-N-vinylamide such as poly-N-vinylformamide, poly-N-vinyl acetamide, poly-N-vinylpyrrolidone, poly-N-vinyl caprolactam, etc., a poly-N-vinylamide copolymer such as a copolymer of a monomer of above listed poly-N-vinylamide and other vinyl compound (vinyl acetate, etc.), polyalkylene glycol such as polyethylene glycol, polypropylene glycol, a copolymer of ethylene glycol and propylene glycol (copolymer having an ethylene oxide unit and a propylene oxide unit), poly THF (polybutylene glycol), etc., polyurethane, a cellulose resin such as methyl cellulose, ethyl cellulose, hydroxy cellulose, methyl hydroxy cellulose, cellulose acetate, etc., and a derivative thereof, a thermoplastic resin such as a polyester resin formed by, for example, copolymerizing aliphatic diol and aliphatic dicarboxylic acid to have a number average molecular weight of 10,000 to 100,000, and a glass-transition temperature (Tg) of −10 to 50° C., a chlorinated polyolefin resin, a polyacrylic resin, a polyvinyl acetal (butyral) resin, etc., or a thermoset resin such as an epoxy resin such as a bisphenol A-type epoxy resin, a bisphenol F-type epoxy resin, a novolak type epoxy resin, an aliphatic polyvalent epoxy resin, an alicyclic glycidyl type polyvalent epoxy resin, etc., an epoxy acrylate resin formed by adding an acrylic acid to the any one of the above listed epoxy resins, a phenol resin, a melamine resin, an urea resin, etc. In general, polyurethane mentioned above is a reaction product of a compound having a hydroxyl group and a compound having an isocyanate group. A preferable example of a compound having a hydroxyl group is, for example, at least one type of polyol selected from a group consisting of polyether polyol (polyethylene glycol, polypropylene glycol, etc.) having a number average molecular weight of 500 to 2000, and more preferably 800 to 1500, polycarbonate polyol, and polyester polyol, at least one type of polyol selected from a group consisting of pentaerythritol, dipentaerythritol, trimethylolpropane, ditrimethylolpropane, and glycerin, or an ethylene oxide adduct and/or an propylene oxide adduct a p-toluenesulfonic acid. A preferable example of a compound having an isocyanate group is, for example, at least one type of diisocyanate selected from a group consisting of dicyclohexylmethane-4,4′-diisocyanate, isophorone diisocyanate, hexamethylene-1,6-diisocyanate, and tolylene diisocyanate. In order to increase the adhesiveness to the substrate, etc., carboxy group containing diol, such as dimethylol propionic acid, dimethylol butanoic acid can be used as a part of the polyol component. The isocyanate group is highly reactive (gradually reacts with moisture in the air), and thus, for example, an isocyanate derivative which is capable of liberating isocyanate by heating oxime-blocked isocyanate, etc., can be used. If the content of the binder resin is too high, the binder resin is located between the metal particle, resulting in decreasing the conductivity. Therefore, the binder resin is 10 parts by mass or less, preferably 5 parts by mass or less, and more preferably 3 parts by mass or less, relative to 100 parts by mass of the metal particles. The content of the binder resin in the conductive composition (ink) is preferably 5% by mass or less, more preferably 2% by mass or less, and still more preferably 1% by mass or less. If the content of the binder resin is too small, the mechanical strength of the obtained thin film itself is reduced, and the adhesive strength of the thin film to the substrate is reduced. Therefore, usually, 0.5 parts by mass or more, preferably 1 part by mass or more of the binder resin is contained relative to 100 parts by mass of the metal particles.

The solvent contains an organic compound having a hydrocarbon group with a bridged cyclic structure and a hydroxyl group, as a solvent for adjusting the viscosity of the conductive composition (ink), the organic compound being, for example, isobornylcyclohexanol, tricyclodecanedimethanol, and/or hydroxydicyclopentadiene. Isobornylcyclohexanol may apply an appropriate viscosity to the conductive ink, by the hydrogen bond of the hydroxyl group in addition to the complicated steric structure of the isobornyl group. Further, a compound having an isobornyl group and a hydroxyl group has high viscosity although the volatilization temperature is not very high. Therefore, the conductive composition (ink) can have high viscosity. Also, since the compound has a boiling point appropriate as an ink solvent, residue can be reduced by appropriate heating, photo-sintering, etc., performed after printing and drying.

Tricyclodecanedimethanol and hydroxydicyclopentadiene may also apply an appropriate viscosity to the conductive ink, by the hydrogen bond of the hydroxyl group in addition to the complicated steric structure of the norbornyl group. Further, a compound having an isobornyl group and a hydroxyl group has high viscosity although the volatilization temperature is not very high. Therefore, the conductive composition (ink) can have high viscosity. Also, since the compound has a boiling point appropriate as an ink solvent, residue can be reduced by appropriate heating, photo-sintering, etc., performed after printing and drying.

In the solvent, the content of the organic compound having a hydrocarbon group with a bridged cyclic structure and a hydroxyl group, such as isobornylcyclohexanol, tricyclodecanedimethanol, and/or hydroxydicyclopentadiene, etc., depends on other solvents used, but is in the range of preferably 5 to 98% by mass, more preferably 20 to 97% by mass, and still more preferably 50 to 95% by mass. If the content of the organic compound having a hydrocarbon group with a bridged cyclic structure and a hydroxyl group, such as isobornylcyclohexanol, tricyclodecanedimethanol, and/or hydroxydicyclopentadiene, etc., is less than 5% by mass, the conductive composition (ink) for thin film printing cannot have an appropriate viscosity, and thus, the printed pattern cannot maintain its shape. If the content exceeds 98% by mass, the viscosity of the conductive ink becomes too high, and thus, stringing at the time of printing becomes worse, and printing itself may not be possible.

The solvent is prepared to have a desired viscosity by mixing the organic compound having a hydrocarbon group with a bridged cyclic structure and a hydroxyl group, such as isobornylcyclohexanol, tricyclodecanedimethanol, and/or hydroxydicyclopentadiene, etc., with other solvent.

Other solvent may be, for example, alcohol, ketone, ester, ether, aliphatic hydrocarbon solvents and aromatic hydrocarbon solvents. In order that each component can be well dispersed in the conductive composition (ink) for thin film printing, a preferable solvent may be ethanol, isopropyl alcohol, 1-methoxy-2-propanol (PGME), ethylene glycol, diethylene glycol, triethylene glycol, dipropylene glycol, ethylene glycol monomethyl ether, ethylene glycol monoethyl ether, ethylene glycol monopropyl ether, diacetone alcohol, ethylene glycol monobutyl ether, propylene glycol, diethylene glycol monomethyl ether, diethylene glycol monoethyl ether, dipropylene glycol monopropyl ether, diethylene glycol monobutyl ether, tripropylene glycol, triethylene glycol monoethyl ether, terpineol, dihydroterpineol, dihydro terpinyl monoacetate, methyl ethyl ketone, cyclohexanone, ethyl lactate, propylene glycol monomethyl ether acetate, diethylene glycol monomethyl ether acetate, diethylene glycol monobutyl ether acetate, ethylene glycol monomethyl ether acetate, ethylene glycol monobutyl ether acetate, dibutyl ether, octane, or toluene, and among them, terpineol and dihydroterpineol are particularly preferable. Each solvent may be used by itself, but two or more kinds of the solvents may be mixed.

The conductive composition (ink) according to the present embodiment may contain any optional components other than the above components (the binder resin, the viscosity adjusting solvent, and the flat metal particles), as far as the characteristics thereof is not damaged. Such optional components may be, for example, a wetting dispersant for improving the wettability to the substrate, a surface conditioner, a defoamer, a thixotropic agent, a leveling agent, a corrosion inhibitor, an adhesion accelerator, a surfactant, a rheology control agent, and the like.

Examples of the wetting dispersant may be DISPERBYK (registered trademark)-106, DISPERBYK (registered trademark)-108 (manufactured by BYK Japan K. K.). Examples of the surface conditioner may be BYK (registered trademark)-300, BYK (registered trademark)-306 (manufactured by BYK Japan K. K.). Examples of the defoamer may be BYK (registered trademark)-051, BYK (registered trademark)-054 (manufactured by BYK Japan K. K.). Examples of the thixotropic agent may be AEROSIL (registered trademark) 380, AEROSIL (registered trademark) R106, AEROSIL (registered trademark) R-812 (manufactured by Nippon Aerosil Co., Ltd.). An example of the leveling agent may be BYKETOL (registered trademark)-OK (manufactured by BYK Japan K. K.). An example of the corrosion inhibitor may be benzotriazole, etc. An example of the adhesion accelerator may be 2-hydroxy methyl cellulose, etc. An example of the surfactant may be Product Name: F-472SF (manufactured by DIC Corporation). Examples of the rheology control agent may be BYK (registered trademark)-405, BYK (registered trademark)-410, BYK (registered trademark)-311 (manufactured by BYK Japan K. K.).

The conductive composition (ink) according to the present embodiment can be produced by subjecting the above components to appropriately selected processes of stirring, mixing, heating, cooling, dissolving, dispersing, etc., by performed by known methods.

A conductive composition (ink) according to the present embodiment has a viscosity at 25° C. of preferably, in case of screen printing, $1.0 \times 10^3$ to $2 \times 10^5$ mPa·s, and more preferably $3.0 \times 10^3$ to $5 \times 10^4$ mPa·s.

A method for forming a conductive pattern according to the present embodiment comprises a step of printing a pattern having any selected shape on a substrate, by screen printing, using any one of the conductive compositions (ink) prepared as above, and a step of subjecting the pattern to thermal sintering at a temperature of 300° C. or less or subjecting the pattern to pulsed light irradiation (photo sintering).

Printing is performed by screen printing. In the present specification the "pattern" includes an entire pattern that the printing is performed over the entirety of the substrate. With respect to a screen mesh, needless to say, a mesh having a smaller transmission capacity is more advantageous. The transmission capacity is preferably 25 $cm^3/cm^2$ or less, and more preferably 20 $cm^3/cm^2$ or less. If the transmission capacity exceeds 25 $cm^3/cm^2$, the film thickness is increased. If the mesh of the mesh of the screen is too fine, metal particles easily clog the mesh. If the mesh is too coarse, pattern printing cannot be performed. Therefore, the mesh count (the number of wires constituting a meth of 1 inch) is preferably 100 to 800, and more preferably 200 to 700. The wire diameter depends on the mesh count, but if the wire is too thick, the transmission capacity becomes too small, whereas if the wire is too thin, the strength of the wire decreases and the mesh is easily broken. Therefore, when the mesh count is 500, the wire diameter is preferably 10 to 30 μm, and more preferably 15 to 25 μm.

With respect to the material for a screen plate, stainless-steel is preferable, in view of the printing precision. If necessary, the screen plate may be subjected to calendering, etc.

The thickness of emulsion applied for forming a pattern of the screen plate is preferably thin, when thin film printing is performed. However, if the thickness is too thin, traces of screen may be transferred. Therefore, the thickness is preferably 1 to 30 μm, and more preferably 2 to 20 μm.

The substrate for pattern printing may be hard (rigid) or easily bent (flexible), and may be colored. The substrate may be a rigid substrate such as a glass substrate, an alumina substrate, a glass epoxy substrate, a paper phenol substrate, an insulating resin coated metal substrate, etc., or may be a flexible substrate such as a polyimide film, a polycarbonate film, a polyether sulfone film, an acrylic film, a polyester (polyethylene terephthalate, polyethylene naphthalate, etc.) film, a polyolefin film, a cyclo olefin polymer film, a cyclo olefin copolymer film, etc. Such substrate may be opaque, but preferably have a high light transmittance and a low haze value, so as to be capable of being applied to wider use. Further, a circuit of TFT elements, etc., or a functional material such as a color filter, etc., may be formed on the substrate. Further, a large number of substrates may be stacked. In the present specification, "a substrate having a low thermal resistance" means a substrate mainly composed of a resin having a glass transition temperature (Tg) of 200° C. or less.

The amount of conductive composition (ink) to be coated on the substrate may be determined taking into account the film thickness of the conductive pattern which is obtained depending on the intended use. The film thickness is selected depending on the intended use. A desired film thickness may be obtained by adjusting the coating amount of the conductive ink and conditions for the coating method. The thicker film thickness is preferable from the viewpoint of a low surface resistance, whereas the thinner film thickness is preferable from the viewpoint of reducing the thickness of a part. Taking these into account comprehensively, the film thickness is preferably 200 to 3000 nm, more preferably 500 to 2000 nm, and still more preferably 700 to 1500 nm.

The printed (coated) conductive ink layer may be subjected to heating and drying in accordance with needs. In the present specification, "drying" refers to removing the solvent by evaporation. The heating temperature for drying may be different depending on the liquid components constituting the dispersion medium, but when the drying temperature is too high, there are drawbacks that foams may be generated when the solvent evaporates, resulting in forming voids. Therefore, the drying temperature is 120° C. or lower at the highest, and more preferably 100° C. or lower. In particular, the first drying temperature is important. Initiating the drying at about 40 to 80° C., and raising the temperature step by step so as not exceeding 120° C., is particularly preferable. Viscous liquid of an organic compound comprising a hydrocarbon group having a bridged cyclic structure, and a hydroxyl group, such as isobornylcyclohexanol, tricyclodecanedimethanol, hydroxydicyclopentadiene, etc., has a high boiling point. If such viscous liquid and a diluting solvent are coexistent in a dispersion medium, and the boiling point of the diluting solvent is lower than the boiling point of the viscous liquid, the diluting solvent having the lower boiling point is preferentially distilled away. Therefore, the viscosity of the dispersion medium may be increased by drying, leading to suppressing the breakage of the print pattern at the time of drying.

In order to form a conductive pattern by the above-mentioned conductive composition (ink), a pattern is printed in any selected shape on a substrate by screen printing using the above conductive composition (ink), the printed pattern is subjected to drying as described above, and the dried pattern is further subjected to a thermal sintering process at 300° C. or less or pulsed light irradiation (photo sintering). By using the conductive composition (ink) according to the present disclosure, a low-resistance thin film (which can be formed to have a thickness of 3 μm or less, further 1 μm or less) can be produced, although such a thin film cannot be realized by screen printing using the conventional conductive composition (ink).

In the thermal sintering process, heating is performed preferably in the range of 100° C. to 300° C., and more preferably from 120° C. to 200° C. If the heating temperature is lower than 100° C., conductivity is not usually obtained, whereas if the temperature is higher than 300° C., a substrate which can be used is limited, and the part, etc., may be damaged. Needless to say, the lower temperature is preferable in view of the wider selectable range of the substrate and parts, and the energy consumed.

The heating device may be a hot plate, a hot air circulation type constant temperature oven, IR furnace, etc. The atmosphere may be an air atmosphere, or may be an inert gas atmosphere or a reducing gas atmosphere, in accordance with needs. Further, the drying step and the thermal sintering step above-mentioned may not be performed separately, but may performed simultaneously or continuously while controlling a temperature profile.

Figure 1:
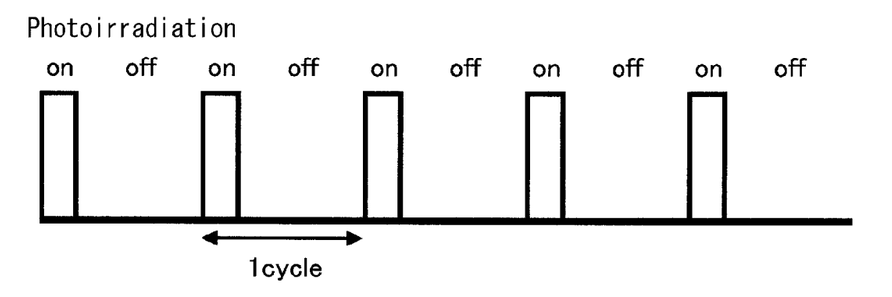
The FIGURE is a diagram illustrating the definition of pulsed light.

In the present specification, the "pulsed light" is a light having a short photo irradiation period (irradiation time). When a plurality of times of photo irradiation are repeated, as shown in the FIGURE, there is a period in which photo irradiation is not performed (irradiation interval (off)) between a first photo irradiation period (on) and a second photo irradiation period (on). In the FIGURE, the pulsed light is illustrated to have a constant light intensity, but the light intensity may vary within one photo irradiation period (on). The pulsed light is irradiated from a light source provided with a flash lamp such as a xenon flash lamp. Using such a light source, pulsed light is irradiated to a thin film printed on the substrate. When irradiation is repeated for n-times, one cycle (on+off) in FIG. 1 is repeated for n-times. At the time of repeated irradiation, it is preferable to cool the substrate side so that the substrate can be cooled to a temperature near the room temperature when the next pulsed light irradiation is performed.

For the pulsed light, electromagnetic waves having a wavelength in the range from 1 pm to 1 m may be used, preferably, electromagnetic waves having a wavelength in the range from 10 nm to 1000 μm may be used (from far ultraviolet to far infrared), and more preferably, electromagnetic waves having a wavelength in the range from 100 nm to 2000 nm may be used. Examples of such electromagnetic wave may be gamma rays, X-rays, ultraviolet rays, visible rays, infrared rays, etc. Considering transformation into thermal energy, too short wavelength is not preferable because a substrate (resin substrate) on which the pattern printing is performed may be largely damaged. Also, too long wavelength is not preferable because efficient absorption and exothermic heating cannot be performed. Accordingly, the wavelength range is preferably the range from the ultraviolet to infrared among the above-mentioned wavelengths, and more preferably, in the range from 100 to 2000 nm.

One irradiation period (on) of the pulsed light is preferably from 20 microseconds to 50 milliseconds, although the period may vary depending on the light intensity. If the period is less than 20 microseconds, sintering of the metal particles does not progress, resulting in providing a lower effect of increasing the performance of a conductive film. If the period is longer than 50 milliseconds, there may be bad influences on the substrate and the binder resin due to photodegradation and thermal degradation, and further, metal particles may be easily blown away. More preferably, the irradiation period is from 40 microseconds to 10 milliseconds. Due to the reasons mentioned above, pulsed light instead of continuous light is used in the present embodiment. A single shot of the pulsed light is effective, but the irradiation may be repeated as mentioned above. When the irradiation is repeated, the irradiation interval (off) is preferably in the range from 20 microseconds to 5 seconds, and more preferably in the range from 2 milliseconds to 2 seconds. If the irradiation interval is shorter than 20 microseconds, the pulsed light becomes similar to a continuous light and another irradiation is performed after one irradiation without leaving enough time for cooling. Thus, the substrate is heated to a very high temperature and may be deteriorated. The irradiation interval longer than 5 seconds is not preferable because the processing time becomes long.

Either one of, or both of the thermal sintering and the pulsed light irradiation may be performed.

The conductive properties of the obtained conductive pattern can be made to have desired values, by adjusting the film thickness, i.e., the coating amount of the composition and conditions of the coating method, and adjusting the concentration of the metal particles in the conductive composition (ink) according to the present embodiment.

In general, the thinner the film thickness, the higher the surface resistivity even when the volume resistances are the same. Further, the higher the concentration of the flat metal particles in the conductive composition (ink), the lower the volume resistivity. Accordingly, in order to reduce the resistivity of a conductive circuit even if the film thickness is thin, the volume resistivity must be reduced, and thus, concentration of the flat metal powder should be increased, and appropriate sintering conditions should be selected.

The conductive pattern obtained as above preferably has a volume resistivity value of $1 \times 10^{-3}$ to $2 \times 10^{-6}$ $\Omega \cdot cm$, and more preferably has a volume resistivity value of $1 \times 10^{-4}$ to $2 \times 10^{-6}$ $\Omega \cdot cm$.

Further, after the above-mentioned sintering process or the pulsed light irradiation, proving a protection layer which protects the conductive pattern is preferably, by adhering a protection film on the upper side of the conductive pattern, by coating a resin ink, drying the coated ink, and curing the ink if necessary. For the protection layer, for example, a 0.5-to-30-μm-thick thermoset resin, ultraviolet curable resin, or thermoplastic resin may be used. Specifically, the protection film may be a PET (polyethylene terephthalate) film, a PEN (polyethylene naphthalate) film, etc., provided with an adhesive layer. As a thermoset resin, an epoxy resin, an urethane resin, an acrylic resin, a phenol resin, a silicone resin, etc., may be exemplified. As an ultraviolet curable resin, an acrylic resin, an alicyclic epoxy resin, may be exemplified. As a thermoplastic resin, a cyclo olefin polymer, a cyclo olefin copolymer, a PMMA (polymethyl methacrylate), may be exemplified.

EXAMPLES

Hereinafter, specific examples of the present disclosure will be explained. The examples are described below for the purpose of easy understanding of the present disclosure, and the present disclosure is not limited to these examples.

Example 1

<Preparation of Conductive Composition (Ink)>

47.3 g of Ag Nano Flake N300 (terpineol dispersion paste having Ag content of 84.5% by mass manufactured by Tokusen Kogyo Co., Ltd.) as flat silver particles, 3.00 g of terpineol C (manufactured by Nippon Terpene Chemicals, Inc.) solution having 40% by mass of polyvinylpyrrolidone (PVP K30), and 49.6 g of Tersorb MTPH (isobornylcyclohexanol, manufactured by Nippon Terpene Chemicals, Inc.) as a solvent, were added, and mixed by Planetary Centrifugal Vacuum Mixer (ARV-310, manufactured by Thinky Corporation) at the maximum stirring speed of 2000 rpm for 30 minutes, to thereby prepare a sample.

<Viscosity Measurement>

Viscosities of the solvent and the conductive composition (ink) at 25° C. were measured using Type B viscometer DV-II+Pro manufactured by Brookfield Engineering. In the measurement, when the viscosity exceeds $1.0 \times 10^4$ mPa·s, a roter No. 52 was used, whereas when the viscosity is $1.0 \times 10^4$ mPa·s or less, a rotor No. 40 was used.

<Printing Conductive Composition (Ink)>

As a screen plate, a calendered mesh having a mesh count of 640 and a wire diameter of 15 μmΦ was subjected to a hardening process using an emulsion IC-10000 (manufactured by Murakami Co., Ltd.) at the film thickness of 5 μm, and was formed into a 2-cm-square patterned screen plate. For the substrate, Teijin Teonex (registered trademark) Q51 (PEN (polyethylene naphthalate) film, 100-μm-thick, manufactured by Teijin DuPont Films Japan Limited) was used. The conductive composition (ink) prepared as above was printed, using the above screen plate, to have a 2-cm-square pattern on the substrate, which was thereafter subjected to thermal sintering at 140° C. for 60 minutes, without preliminary drying, to thereby form a thin film conductive pattern.

<Measurement of Film Thickness>

Measurement was performed by FE-SEM S-5200, manufactured by Hitchi High-Technologies Corporation.

<Volume Resistivity Measurement>

The volume resistivity of the formed conductive pattern was measured by the four-point probe surface resistivity/volume resistivity measurement device LORESTA (registered trademark)-GP MCP-T610, manufactured by Mitsubishi Chemical Corporation.

Examples 2 to 15 Comparative Examples 1 to 5

Similar to the ink preparation of Example 1, conductive compositions (ink) of Examples 2 to 15 and Comparative Examples 1 to 5 were prepared using various metal (silver) particles, binder resins, and solvents. Tables 1 to 3 show compositions of the conductive compositions (ink) according to Examples 2 to 15 and Comparative Examples 1 to 5, as well as Example 1, and evaluation results of the conductive patterns made by these conductive compositions (ink). Tables 1 and 2 show the used silver particles 1 (silver particles 2 were not used in Examples 1 to 15 and Comparative Example 1 to 5), binder solutions, solvents 1, and solvents 2. Table 3 shows respective conductive compositions (ink) and evaluation results of the conductive pattern prepared by the respective conductive compositions (ink). Table 6 shows the shape of each raw material metal (silver) particle used in Examples and Comparative Examples.

In each of Examples 11 to 13, conductive composition was prepared as below, by mixing two types of materials each constituting a binder by thermal treatment. Further, the synthetic binders (A) and (B) used in Examples 14 and 15 were prepared as below, respectively.

Preparation of Conductive Composition for Example 11

53.3 g of Ag Nano Flake N300 (terpineol dispersion paste having Ag content of 84.5% by mass, manufactured by Tokusen Kogyo Co., Ltd.) as flat silver particles, 0.543 g of ethylene oxide adduct of p-toluenesulfonamide PTSA-40X (manufactured by Meisei Chemical Works, Ltd.), 0.812 g of blocked isocyanate BL4265SN (manufactured by Sumika Bayer Urethane Co., Ltd.), and 45.3 g of Tersorb MTPH (isobornylcyclohexanol, manufactured by Nippon Terpene Chemicals, Inc.) as a solvent, were added, and mixed by Planetary Centrifugal Vacuum Mixer (ARV-310, manufactured by Thinky Corporation) at the maximum stirring speed of 2000 rpm for 30 minutes, to thereby prepare a sample.

Preparation of Conductive Composition for Example 12

53.4 g of Ag Nano Flake N300 (terpineol dispersion paste having Ag content of 84.5% by mass, manufactured by Tokusen Kogyo Co., Ltd.) as flat silver particles, 0.592 g of ethylene oxide adduct of p-toluenesulfonamide PTSA-40X (manufactured by Meisei Chemical Works, Ltd.), 0.766 g of blocked isocyanate 17B-60P (manufactured by Asahi Kasei Corporation), and 45.4 g of Tersorb MTPH (isobornylcyclohexanol, manufactured by Nippon Terpene Chemicals, Inc.) as a solvent, were added, and mixed by Planetary Centrifugal Vacuum Mixer (ARV-310, manufactured by Thinky Corporation) at the maximum stirring speed of 2000 rpm for 30 minutes, to thereby prepare a sample.

Preparation of Conductive Composition for Example 13

53.3 g of Ag Nano Flake N300 (terpineol dispersion paste having Ag content of 84.5% by mass, manufactured by Tokusen Kogyo Co., Ltd.) as flat silver particles, 0.641 g of ethylene oxide adduct of p-toluenesulfonamide PTSA-40X (manufactured by Meisei Chemical Works, Ltd.), 0.756 g of blocked isocyanate SBB-70P (manufactured by Asahi Kasei Corporation), and 45.6 g of Tersorb MTPH (isobornylcyclohexanol, manufactured by Nippon Terpene Chemicals, Inc.) as a solvent, were added, and mixed by Planetary Centrifugal Vacuum Mixer (ARV-310, manufactured by Thinky Corporation) at the maximum stirring speed of 2000 rpm for 30 minutes, to thereby prepare a sample.

Synthesis of Synthesized Binder (A) Used in Example 14

30.25 g of diol (Kuraray Polyol C-1015N (polycarbonate diol, number average molecular weight 1000) manufactured by Kuraray Co., Ltd.), 13.08 g of dimethylol butanoic acid, and 71.77 g of tetrahydrofuran (THF) were provided in a 500 ml separable flask, which was subjected to heating in an oil bath at 80° C. to be sufficiently dissolved. 28.74 g of diisocyanate (Desmodur (registered trademark) W (dicyclohexylmethane-4,4'-diisocyanate), manufactured by Sumika Bayer Urethane Co., Ltd.) was slowly dropped thereto using a dropping funnel, which was heated and stirred at 100° C. for two hours, and subsequently at 110° C. for one hour, to thereby obtain Synthetic Binder (A).

Synthesis of Synthesized Binder (B) Used in Example 15

38.21 g of diol (polypropylene glycol, UNIOL D-1000 (number average molecular weight 1000) manufactured by NOF Corporation), 30.03 g of dimethylol butanoic acid, and 125.96 g of propylene glycol methyl ether acetate (PGMEA) were provided in a 1000 ml separable flask, which was subjected to heating in an oil bath at 80° C. to be sufficiently dissolved. 57.86 g of diisocyanate (Desmodur (registered trademark) W (dicyclohexylmethane-4,4'-diisocyanate), manufactured by Sumika Bayer Urethane Co., Ltd.) was slowly dropped thereto using a dropping funnel, which was heated and stirred at 100° C. for two hours, and subsequently at 110° C. for one hour, to thereby obtain Synthetic Binder (B).

In Examples 14 and 15, the conductive compositions were prepared in the same way as Example 1, except that the silver particles, binder solutions, and solvents shown in Table 1 were used.

TABLE 1

| | | Silver Particle 1 | | | | | Silver Particle 2 | | | |
|---|---|---|---|---|---|---|---|---|---|---|
| Example | Name | Metal Concentration [% by mass] | Paste or Silver Particle by Mass [g] | Metal by Mass [g] | Solvent in Paste by Mass [g] | Name | Metal Concentration [% by mass] | Paste or Silver Particle by Mass [g] | Metal by Mass [g] | Solvent in Paste by Mass [g] |
| 1 | Ag Nano Flake N300 in Terpineol | 84.5 | 47.3 | 40.0 | 7.3 | | | | | |
| 2 | LM1 | 100.0 | 40.0 | 40.0 | 0.0 | | | | | |
| 3 | Ag-XF301K | 100.0 | 40.0 | 40.0 | 0.0 | | | | | |
| 4 | Ag Nano Flake M13 | 100.0 | 40.0 | 40.0 | 0.0 | | | | | |
| 5 | Ag Nano Flake N300 in Terpineol | 84.5 | 23.7 | 20.0 | 3.7 | | | | | |
| 6 | Ag Nano Flake N300 in Terpineol | 84.5 | 71.0 | 60.0 | 11.0 | | | | | |
| 7 | LM1 | 100.0 | 40.0 | 40.0 | 0.0 | | | | | |
| 8 | Ag Nano Flake N300 in Terpineol | 84.5 | 47.3 | 40.0 | 7.3 | | | | | |
| 9 | Ag Nano Flake N300 in Terpineol | 84.5 | 47.3 | 40.0 | 7.3 | | | | | |
| 10 | Ag Nano Flake N300 in Terpineol | 84.5 | 47.3 | 40.0 | 7.3 | | | | | |
| 11 | Ag Nano Flake N300 in Terpineol | 84.5 | 53.3 | 45.0 | 8.3 | | | | | |
| 12 | Ag Nano Flake N300 in Terpineol | 84.5 | 53.4 | 45.1 | 8.3 | | | | | |
| 13 | Ag Nano Flake N300 in Terpineol | 84.5 | 53.3 | 45.0 | 8.3 | | | | | |

TABLE 1-continued

| | | | | | |
|---|---|---|---|---|---|
| 14 | Ag Nano Flake N300 in Terpineol | 84.5 | 53.4 | 45.1 | 8.3 |
| 15 | Ag Nano Flake N300 in Terpineol | 84.1 | 47.7 | 40.1 | 7.6 |

| | | | Binder Solution | | | | | | | |
|---|---|---|---|---|---|---|---|---|---|---|
| Example | Binder | Solvent | Binder Solution by Mass [g] | Binder Concentration [% by mass] | Binder in Solution by Mass [g] | Solvent in Solution by Mass [g] | Solvent 1 Name | Mass [g] | Solvent 2 Name | Mass [g] |
| 1 | PVP (K30) | Terpineol C | 3.0 | 40.0 | 1.2 | 1.8 | MTPH | 49.6 | | |
| 2 | PVP (K30) | Terpineol C | 3.0 | 40.0 | 1.2 | 1.8 | MTPH | 56.9 | | |
| 3 | PVP (K30) | Terpineol C | 3.0 | 40.0 | 1.2 | 1.8 | MTPH | 56.9 | | |
| 4 | PVP (K30) | Terpineol C | 3.0 | 40.0 | 1.2 | 1.8 | MTPH | 56.9 | | |
| 5 | PVP (K30) | Terpineol C | 1.5 | 40.0 | 0.6 | 0.9 | MTPH | 74.7 | | |
| 6 | PVP (K30) | Terpineol C | 4.5 | 40.0 | 1.8 | 2.7 | MTPH | 24.5 | | |
| 7 | PVP (K30) | Terpineol C | 8.0 | 40.0 | 3.2 | 4.8 | MTPH | 52.0 | | |
| 8 | ETHOCEL STD100CPS | Terpineol C | 12.0 | 10.0 | 1.2 | 10.8 | MTPH | 40.7 | | |
| 9 | BRG556 | Terpineol C | 1.2 | 100.0 | 1.2 | 0.0 | MTPH | 51.4 | | |
| 10 | S-LEC BL-2H | Terpineol C | 6.0 | 20.0 | 1.2 | 4.8 | MTPH | 46.7 | | |
| 11 | PTSA-40X/ BL4265SN | | 0.543/0.812 | 100.0 | 1.36 | 0 | MTPH | 45.3 | | |
| 12 | PTSA-40X/ 17B-60P | | 0.592/0.766 | 100.0 | 1.36 | 0 | MTPH | 45.4 | | |
| 13 | PTSA-40X/ SBB-70P | | 0.641/0.756 | 100.0 | 1.4 | 0 | MTPH | 45.6 | | |
| 14 | Synethetic Binder (A) | THF | 2.29 | 60.0 | 1.37 | 0.92 | MTPH | 39.9 | Terpineol C | 4.5 |
| 15 | Synethetic Binder (B) | PGMEA | 2.34 | 50.0 | 1.17 | 1.17 | MTPH | 51.0 | | |

TABLE 2

| | | Silver Particle 1 | | | | | Silver Particle 2 | | | |
|---|---|---|---|---|---|---|---|---|---|---|
| Comparative Example | Name | Metal Concentration [% by mass] | Paste or Silver Particle by Mass [g] | Metal by Mass [g] | Solvent in Paste by Mass [g] | Name | Metal Concentration [% by mass] | Paste or Silver Particle by Mass [g] | Metal by Mass [g] | Solvent in Paste by Mass [g] |
| 1 | T5A-A01 | 100.0 | 4.00 | 4.00 | 0.00 | | | | | |
| 2 | SF-K | 100.0 | 4.00 | 4.00 | 0.00 | | | | | |
| 3 | Ag Nano Flake N300 in Terpineol | 84.5 | 1.21 | 1.02 | 0.19 | | | | | |
| 4 | LM1 | 100.0 | 4.00 | 4.00 | 0.00 | | | | | |
| 5 | LM1 | 100.0 | 8.00 | 8.00 | 0.00 | | | | | |

| | | | Binder Solution | | | | | | | |
|---|---|---|---|---|---|---|---|---|---|---|
| Comparative Example | Binder | Solvent | Binder Solution by Mass [g] | Binder Concentration [% by mass] | Binder in Solution by Mass [g] | Solvent in Solution by Mass [g] | Solvent 1 Name | Mass [g] | Solvent 2 Name | Mass [g] |
| 1 | PVP (K30) | Terpineol C | 0.300 | 40.0 | 0.120 | 0.180 | MTPH | 5.69 | | |
| 2 | PVP (K30) | Terpineol C | 0.300 | 40.0 | 0.120 | 0.180 | MTPH | 5.69 | | |
| 3 | PVP (K30) | Terpineol C | 0.120 | 40.0 | 0.048 | 0.072 | MTPH | 8.30 | Terpineol C | 0.64 |
| 4 | PVP (K30) | Terpineol C | 1.501 | 40.0 | 0.600 | 0.901 | MTPH | 4.50 | | |
| 5 | PVP (K30) | Terpineol C | 0.600 | 40.0 | 0.240 | 0.360 | MTPH | 0.40 | Terpineol C | 1.00 |

TABLE 3

| | Mass Ratio [% by mass] (Calculated Value based on Feed Value) | | | | Ratio | |
|---|---|---|---|---|---|---|
| | | | | | Binder [part by mass] | |
| | Metal Particle | Binder | MTPH/ tricyclodecanedimethanol/ hydroxydicyclopentadiene | Other Solvent | (relative to 100 parts by mass of total metal) | MTPH, etc./ total solvent [% by mass] |
| Example 1 | 40.0 | 1.2 | 49.6 | 9.1 | 3.0 | 84.4 |
| Example 2 | 40.0 | 1.2 | 57.0 | 1.8 | 3.0 | 96.9 |
| Example 3 | 40.0 | 1.2 | 57.0 | 1.8 | 3.0 | 96.9 |
| Example 4 | 40.0 | 1.2 | 57.0 | 1.8 | 3.0 | 96.9 |
| Example 5 | 20.0 | 0.6 | 74.8 | 4.6 | 3.0 | 94.2 |
| Example 6 | 60.0 | 1.8 | 24.5 | 13.7 | 3.0 | 64.1 |
| Example 7 | 40.0 | 3.2 | 52.0 | 4.8 | 8.0 | 91.5 |
| Example 8 | 40.0 | 1.2 | 40.7 | 18.1 | 3.0 | 69.2 |
| Example 9 | 40.0 | 1.2 | 51.4 | 7.3 | 3.0 | 87.5 |
| Example 10 | 40.0 | 1.2 | 46.7 | 12.1 | 3.0 | 79.4 |
| Example 11 | 45.0 | 1.4 | 45.3 | 8.3 | 3.0 | 84.5 |
| Example 12 | 45.0 | 1.4 | 45.4 | 8.3 | 3.0 | 84.5 |
| Example 13 | 45.0 | 1.4 | 45.6 | 8.3 | 3.1 | 84.6 |
| Example 14 | 45.1 | 1.4 | 39.9 | 13.7 | 3.0 | 91.6 |
| Example 15 | 39.7 | 1.2 | 51.0 | 8.8 | 2.9 | 85.3 |
| Comparative Example 1 | 40.0 | 1.2 | 57.0 | 1.8 | 3.0 | 96.9 |
| Comparative Example 2 | 40.0 | 1.2 | 57.0 | 1.8 | 3.0 | 96.9 |
| Comparative Example 3 | 10.0 | 0.5 | 80.8 | 8.8 | 4.7 | 97.0 |
| Comparative Example 4 | 40.0 | 6.0 | 45.0 | 9.0 | 15.0 | 83.3 |
| Comparative Example 5 | 80.0 | 2.4 | 4.0 | 13.6 | 3.0 | 52.6 |

| | Viscosity | | | Sintering Conditions | | Evaluation after Sintering | |
|---|---|---|---|---|---|---|---|
| | | | | | | Film | |
| | Roter No. | Number of Rotations | mPa·s at 25° C. | Temperature [° C.] | Time [min] | Thickness [μm] | Volume Resistivity [Ω·cm] |
| Example 1 | 52 | 2 | 26000 | 140 | 60 | 0.73 | $2.3 \times 10^{-5}$ |
| Example 2 | 52 | 2 | 89000 | 140 | 60 | 0.74 | $1.2 \times 10^{-5}$ |
| Example 3 | 52 | 2 | 72000 | 140 | 60 | 0.92 | $9.5 \times 10^{-6}$ |
| Example 4 | 52 | 2 | 68000 | 140 | 60 | 1.03 | $1.7 \times 10^{-5}$ |
| Example 5 | 52 | 2 | 54000 | 140 | 60 | 0.47 | $1.3 \times 10^{-4}$ |
| Example 6 | 40 | 2 | 7000 | 140 | 60 | 2.53 | $8.2 \times 10^{-5}$ |
| Example 7 | 52 | 2 | 78000 | 140 | 60 | 0.81 | $4.6 \times 10^{-4}$ |
| Example 8 | 40 | 2 | 8200 | 200 | 60 | 0.86 | $8.4 \times 10^{-6}$ |
| Example 9 | 52 | 2 | 34000 | 200 | 60 | 0.78 | $9.5 \times 10^{-6}$ |
| Example 10 | 52 | 2 | 18000 | 200 | 60 | 0.81 | $7.2 \times 10^{-6}$ |
| Example 11 | 52 | 2 | 35000 | 140 | 60 | 0.93 | $1.1 \times 10^{-5}$ |
| Example 12 | 52 | 2 | 56000 | 140 | 60 | 1.21 | $1.9 \times 10^{-5}$ |
| Example 13 | 52 | 2 | 61000 | 140 | 60 | 0.87 | $2.4 \times 10^{-5}$ |
| Example 14 | 52 | 2 | 92000 | 140 | 60 | 0.85 | $1.5 \times 10^{-5}$ |
| Example 15 | 52 | 2 | 86000 | 140 | 60 | 0.72 | $2.1 \times 10^{-5}$ |
| Comparative Example 1 | 52 | 2 | 160000 | 140 | 60 | 0.65 | $4.8 \times 10^{-3}$ |
| Comparative Example 2 | 52 | 2 | 120000 | 140 | 60 | 0.95 | $1.1 \times 10^{-2}$ |
| Comparative Example 3 | 52 | 2 | 67000 | 140 | 60 | 0.25 | Partly blurred |
| Comparative Example 4 | 52 | 2 | 45000 | 140 | 60 | 0.92 | 320 |
| Comparative Example 5 | 52 | 2 | 130000 | 140 | 60 | 6.32 | $6.4 \times 10^{-5}$ |

Examples 16 to 20

Table 4 shows compositions of the conductive compositions (ink) according to Examples 16 to 20, prepared in the same way as the ink preparation of Example 1, using various metal (silver) particles, binder resins, and solvents. In Table 4, the used silver particles (silver particle 1, silver particle 2), binder solutions, solvents 1, and solvents 2 are shown. Further, Table 5 shows evaluation results of conductive compositions (ink) of Examples 16 to 20 and conductive patterns prepared by these compositions. Table 6 shows shapes of raw material metal (silver) particles used in Examples 16 to 20.

In Examples 16 and 17, two kinds of solvents, i.e., tricyclodecanedimethanol and dihydroterpineol (Example 16), and two kinds of solvents i.e., tricyclodecanedimethanol and hydroxydicyclopentadiene (Example 17), were used as a solvent, instead of Tersorb MTPH. In Examples 18 and 19, two kinds of solvents, i.e., Tersorb MTPH and terpineol were used. Further, in Comparative Examples 3 and 5 (Table 2), Tersorb MTPH and C terpineol were used.

In Examples 18 to 20, two kinds of silver particles were used. In Example 18, Ag Nano Flake N300 and T5A-A01 (spherical silver particle, manufactured by DOWA Electronics Materials Co., Ltd.) were mixed. In Examples 19 and 20, AgC-204B (flat silver particle, manufactured by Fukuda Metal Foil & Powder Co., Ltd.) and T5A-A01 (spherical silver particle, manufactured by DOWA Electronics Materials Co., Ltd.) were mixed.

TABLE 4

| | | Silver Particle 1 | | | | Silver Particle 2 | | | |
|---|---|---|---|---|---|---|---|---|---|
| Example | Name | Metal Concentration [% by mass] | Paste or Silver Particle by Mass [g] | Metal by Mass [g] | Solvent in Paste by Mass [g] | Name | Metal Concentration [% by mass] | Paste or Silver Particle by Mass [g] | Metal by Mass [g] | Solvent in Paste by Mass [g] |
| 16 | Ag Nano Flake N300 in Terpineol | 84.5 | 47.3 | 40.0 | 7.3 | | | | | |
| 17 | Ag Nano Flake N300 in Terpineol | 84.5 | 47.3 | 40.0 | 7.3 | | | | | |
| 18 | Ag Nano Flake N300 in Terpineol | 84.5 | 23.7 | 20.0 | 3.7 | T5A-A01 | 100.0 | 20.0 | 20.0 | 0.0 |
| 19 | AgC-204B | 100.0 | 30.0 | 30.0 | 0.0 | T5A-A01 | 100.0 | 10.0 | 10.0 | 0.0 |
| 20 | AgC-204B | 100.0 | 20.0 | 20.0 | 0.0 | T5A-A01 | 100.0 | 20.0 | 20.0 | 0.0 |

| | Binder Solution | | | | | | | | |
|---|---|---|---|---|---|---|---|---|---|
| Example | Binder | Solvent | Binder Solution by Mass [g] | Binder Concentration [% by mass] | Binder in Solution by Mass [g] | Solvent in Solution by Mass [g] | Solvent 1 Name | Solvent 1 Mass [g] | Solvent 2 Name | Solvent 2 Mass [g] |
| 16 | S-LEC BL-2H | dihydroterpineol | 6.00 | 20.0 | 1.20 | 4.80 | tricyclodecane dimethanol | 36.7 | dihydroterpineol | 10.0 |
| 17 | S-LEC BL-2H | dihydroterpineol | 6.00 | 20.0 | 1.20 | 4.80 | tricyclodecane dimethanol | 26.7 | hydroxydicyclo-pentadiene | 20.0 |
| 18 | S-LEC BL-2H | Terpineol C | 6.00 | 20.0 | 1.20 | 4.80 | MTPH | 46.7 | Terpineol | 7.3 |
| 19 | S-LEC BL-2H | Terpineol C | 6.00 | 20.0 | 1.20 | 4.80 | MTPH | 46.7 | Terpineol | 7.3 |
| 20 | S-LEC BL-2H | Terpineol C | 6.00 | 20.0 | 1.20 | 4.80 | MTPH | 46.7 | | |

TABLE 5

| | Mass Ratio [% by mass] (Calculated Value based on Feed Value) | | | | Ratio Binder [part by mass] | |
|---|---|---|---|---|---|---|
| | Metal Particle | Binder | MTPH/ tricyclodecanedimethanol hydroxydicyclopentadiene | Other Solvent | (relative to 100 parts by mass of total metal) | MTPH, etc./ total solvent [% by mass] |
| Example 16 | 40.0 | 1.2 | 36.7 | 22.1 | 3.0 | 62.4 |
| Example 17 | 40.0 | 1.2 | 46.7 | 12.1 | 3.0 | 79.4 |
| Example 18 | 40.0 | 1.2 | 46.7 | 12.1 | 3.0 | 79.4 |
| Example 19 | 40.0 | 1.2 | 46.7 | 12.1 | 3.0 | 79.4 |
| Example 20 | 40.0 | 1.2 | 46.7 | 12.1 | 3.0 | 79.4 |

| | Viscosity | | | Sintering Conditions | | Evaluation after Sintering | Volume |
|---|---|---|---|---|---|---|---|
| | Roter No. | Number of Rotations | mPa·s at 25° C. | Temperature [° C.] | Time [min] | Film Thickness [μm] | Resistivity [Ω·cm] |
| Example 16 | 52 | 2 | 36000 | 140 | 60 | 0.87 | $8.9 \times 10^{-6}$ |
| Example 17 | 52 | 2 | 28000 | 140 | 60 | 0.92 | $9.1 \times 10^{-6}$ |
| Example 18 | 52 | 2 | 21000 | 140 | 60 | 0.77 | $9.8 \times 10^{-6}$ |
| Example 19 | 52 | 2 | 64000 | 140 | 60 | 0.75 | $6.5 \times 10^{-6}$ |
| Example 20 | 52 | 2 | 48000 | 140 | 60 | 0.79 | $7.1 \times 10^{-6}$ |

In Table 1, Table 2, and Table 4, C-terpineol is a mixture of isomers of α-, β-, γ-terpineol, manufactured by Nippon Terpene Chemicals, Inc.; PVP (K30) is polyvinylpyrrolidone (K30), manufactured by Nippon Shokubai Co., Ltd.; ETHOCEL (registered trademark) STD100CPS is cellulose acetate, manufactured by Nisshin Kasei Co., Ltd.; PTSA-40X is ethylene oxide adduct of p-toluenesulfonamide, manufactured by Meisei Chemical Works, Ltd.; BL4265SN is blocked isocyanate, manufactured Sumika Bayer Urethane Co., Ltd.; 17B-60P and SBB-70P are blocked isocyanate, manufactured by Asahi Kasei Corporation; BRG556 is a phenol novolak resin manufactured by Showa Denko K.K.; S-LEC (registered trademark) BL-2H is a butyral resin, manufactured by Sekisui Chemical Co., Ltd.; MTPH is Tersorb MTPH, isobornylcyclohexanol, manufactured by Nippon Terpene Chemicals, Inc.; THF is tetrahydrofuran; and PGMEA is propylene glycol methyl ether acetate.

Regarding evaluation after sintering in Table 3, since a uniform coating film was not obtained in Comparative Example 3, volume resistivity was not measured. The film thickness was measured at the portion which is not blurred.

TABLE 6

| Silver Particle Product Name | Manufacturer | Particle Shape | Width [nm] | Thickness [nm] | Aspect Ratio |
|---|---|---|---|---|---|
| T5A-A01 | DOWA Electronics Materials Co., Ltd. | Spherical | 30 | 30 | 1.00 |
| SF-K | Mitsui Mining & Smelting, Co., Ltd. | Flake | 2400 | 520 | 4.62 |
| N300 | Tokusen Kogyo Co., Ltd. | Flat | 300 | 30 | 10.00 |
| LM1 | Tokusen Kogyo Co., Ltd. | Flat | 800 | 35 | 22.86 |
| Ag-XF301K | Fukuda Metal Foil & Powder Co., Ltd. | Flat | 2520 | 400 | 6.30 |
| M13 | Tokusen Kogyo Co., Ltd. | Flat | 1600 | 45 | 35.56 |
| AgC-204B | Fukuda Metal Foil & Powder Co., Ltd. | Flat | 1200 | 40 | 30.00 |

In Table 6, T5A-A01 has a shape of comparatively close to perfect sphere; N300 and M13 are plate-like flat powders; N300 is obtained as a paste dispersed in a solvent; LM1 is a plate-like flat powders containing a small amount of fine powder; SF-K and Ag-XF301K are flake powders, but the powder having an aspect ratio 5 or more is treated as a flat powder; and AgC-204B is a plate-like flat powder. In Table 6, flake means a metal powder which is not plate-like, but is waved.

Example 21

Photo-Sintering

The conductive composition (ink) prepared in Example 1 was printed on Teijin Teonex Q51 (100 μm thick), air-dried for one night, and was subjected to pulsed light irradiation using a xenon irradiation device, Pulse Forge 3300, manufactured by NovaCentrix. Irradiation conditions of the pulsed light were light source drive voltage of 400 V, and 30-times irradiation with irradiation time of 100 μsec, at an interval of 4 Hz. After the irradiation, a low resistance thin film conductive pattern having a thickness of 0.75 μm and a volume resistivity of $8.2 \times 10^{-6}$ Ω·cm, was obtained.

As shown in Table 3 and Table 5, all Examples show preferable evaluation results in terms of the film thickness and the volume resistivity.

On the other hand, in Comparative Example 1 where only spherical particles (T5A-A01) were used as silver particles, has a high volume resistivity ($4.8 \times 10^{-3}$ Ω·cm). In Comparative Example 2 where SF-K which are silver particles having an aspect ratio of less than 5 were used, has a high volume resistivity ($1.1 \times 10^{-2}$ Ω·cm). In Comparative Example 3, the content of the silver particles in the ink was low, i.e., 10% by mass, and thus, a uniform coating film could not be obtained, the print was partially blurred. In Comparative Example 4, the ratio in mass of the binder relative to 100 parts by mass of the metal particles (binder/total metal) was high, i.e., 15 parts by mass, and thus, volume resistivity was high (320 Ω·cm). In Comparative Example 5, the content of silver particle in the ink was high, i.e., 80% by mass, and thus, the thickness of the sintered film was thick (6.32 μm).

The invention claimed is:

1. A conductive composition for thin film printing comprising metal particles, a binder resin, and a solvent, the content of an organic compound in the solvent being 24.5 to 74.8% by mass, the organic compound comprising a hydrocarbon group having a bridged cyclic structure and a hydroxyl group, the content of metal particles being 15 to 60% by mass, the metal particles containing 20% by mass or more of flat metal particles, the content of the binder resin being 0.5 to 10 parts by mass relative to 100 parts by mass of the metal particles, and the viscosity at 25° C. being $1.0 \times 10^3$ to $2 \times 10^5$ mPa·s.

2. A conductive composition for thin film printing according to claim 1, wherein the organic compound comprising a hydrocarbon group having a bridged cyclic structure and a hydroxyl group is at least one of isobornylcyclohexanol, tricyclodecanedimethanol, or hydroxydicyclopentadiene.

3. A conductive composition for thin film printing according to claim 1, wherein the metal particles contain 40% by mass or more of flat metal particles.

4. A conductive composition for thin film printing according to claim 1 wherein flat metal particle is a sliver flat particle having an aspect ratio (width/thickness of the flat metal particle) of 5 to 200.

5. A conductive composition for thin film printing according to claim 1, wherein the metal particles are a mixture of a plurality of kinds of metal particles.

6. A conductive composition for thin film printing according to claim 5, wherein the plurality of kinds of metal particles comprises flat particles and spherical nanoparticles.

7. A conductive composition for thin film printing according to claim 1, wherein the binder resin is one selected from a group consisting of poly-N-vinylamide, polyalkylene glycol, polyurethane, a cellulose resin and its derivative, a polyester resin, a chlorinated polyolefin resin, a polyacrylic resin, a polyvinyl acetal (butyral) resin, an epoxy resin, an epoxy acrylate resin, a phenol resin, a melamine resin, and an urea resin.

8. A conductive composition for thin film printing according to claim 7, wherein the poly-N-vinylamide is at least one selected from a group consisting of poly-N-vinylformamide, poly-N-vinyl acetamide, poly-N-vinylpyrrolidone, and poly-N-vinyl caprolactam, and a copolymer of a monomer of one of these and another vinyl compound; the polyalkylene glycol is at least one selected from a group consisting of polyethylene glycol, polypropylene glycol, a copolymer of ethylene glycol and propylene glycol, and polytetrahydrofuran; the cellulose resin is at least one selected from a group consisting of methyl cellulose, ethyl cellulose, hydroxy cellulose, methyl hydroxy cellulose, and cellulose acetate; and the epoxy resin is at least one selected from a group consisting of a bisphenol-A-type epoxy resin, a bisphenol-F-type epoxy resin, a novolak type epoxy resin, an aliphatic polyvalent epoxy resin, and an alicyclic glycidyl type polyvalent epoxy resin.

9. A conductive composition for thin film printing according to claim 7, wherein the polyurethane is a reactant of at least one hydroxyl group containing compound and at least one isocyanate group containing compound; the hydroxyl group containing compound being at least one type of polyol selected from a group consisting of polyether polyol, polycarbonate polyol, and polyester polyol, at least one type of polyol selected from a group consisting of pentaerythritol, dipentaerythritol, trimethylolpropane, ditrimethylolpropane, and glycerin, or an ethylene oxide adduct and/or an propylene oxide adduct of a p-toluenesulfonic acid; and the isocyanate group containing compound being at least one selected from a group consisting of dicyclohexylmethane-4,4'-diisocyanate, isophorone diisocyanate, hexamethylene-1,6-diisocyanate, and tolylene diisocyanate.

10. A method for forming a thin film conductive pattern comprising a step of printing a pattern having any selected shape on a substrate, by screen printing, using a conductive composition for thin film printing according to claim 1, and a step of subjecting the pattern to thermal sintering at a temperature of 300° C. or less and/or subjecting the pattern to pulsed light irradiation.

11. A method for forming a thin film conductive pattern comprising a step of printing a pattern having any selected shape on a substrate, by screen printing, using a conductive composition for thin film printing according to claim 2, and a step of subjecting the pattern to thermal sintering at a temperature of 300° C. or less and/or subjecting the pattern to pulsed light irradiation.

12. A method for forming a thin film conductive pattern comprising a step of printing a pattern having any selected shape on a substrate, by screen printing, using a conductive composition for thin film printing according to claim 3, and a step of subjecting the pattern to thermal sintering at a temperature of 300° C. or less and/or subjecting the pattern to pulsed light irradiation.

13. A method for forming a thin film conductive pattern comprising a step of printing a pattern having any selected shape on a substrate, by screen printing, using a conductive composition for thin film printing according to claim 4, and a step of subjecting the pattern to thermal sintering at a temperature of 300° C. or less and/or subjecting the pattern to pulsed light irradiation.

14. A method for forming a thin film conductive pattern comprising a step of printing a pattern having any selected shape on a substrate, by screen printing, using a conductive composition for thin film printing according to claim 5, and a step of subjecting the pattern to thermal sintering at a temperature of 300° C. or less and/or subjecting the pattern to pulsed light irradiation.

15. A method for forming a thin film conductive pattern comprising a step of printing a pattern having any selected shape on a substrate, by screen printing, using a conductive composition for thin film printing according to claim 6, and a step of subjecting the pattern to thermal sintering at a temperature of 300° C. or less and/or subjecting the pattern to pulsed light irradiation.

16. A method for forming a thin film conductive pattern comprising a step of printing a pattern having any selected shape on a substrate, by screen printing, using a conductive composition for thin film printing according to claim 8, and a step of subjecting the pattern to thermal sintering at a temperature of 300° C. or less and/or subjecting the pattern to pulsed light irradiation.

17. A method for forming a thin film conductive pattern comprising a step of printing a pattern having any selected shape on a substrate, by screen printing, using a conductive composition for thin film printing according to claim 8, and a step of subjecting the pattern to thermal sintering at a temperature of 300° C. or less and/or subjecting the pattern to pulsed light irradiation.

18. A method for forming a thin film conductive pattern comprising a step of printing a pattern having any selected shape on a substrate, by screen printing, using a conductive composition for thin film printing according to claim 9, and a step of subjecting the pattern to thermal sintering at a temperature of 300° C. or less and/or subjecting the pattern to pulsed light irradiation.

* * * * *

UNITED STATES PATENT AND TRADEMARK OFFICE
CERTIFICATE OF CORRECTION

PATENT NO. : 9,845,404 B2
APPLICATION NO. : 15/032388
DATED : December 19, 2017
INVENTOR(S) : Hiroshi Uchida et al.

It is certified that error appears in the above-identified patent and that said Letters Patent is hereby corrected as shown below:

In the Claims

In Claim 16, at Column 24, Line 23:
Delete "claim 8" and insert --claim 7--.

Signed and Sealed this
Twenty-sixth Day of June, 2018

Andrei Iancu
*Director of the United States Patent and Trademark Office*